United States Patent
Sipilä et al.

(10) Patent No.: US 11,486,773 B2
(45) Date of Patent: Nov. 1, 2022

(54) NON-CONTACT MAGNETOSTRICTIVE SENSORS AND METHODS OF OPERATION OF SUCH SENSORS

(71) Applicant: General Electric Company, Schenectady, NY (US)

(72) Inventors: Pekka Tapani Sipilä, Bavaria (DE); Mark Ronald Lynass, Bavaria (DE); Victor Donald Samper, Bavaria (DE); Ronghui Zhou, Shanghai (CN)

(73) Assignee: BAKER HUGHES, A GE COMPANY, LLC, Houston, TX (US)

( * ) Notice: Subject to any disclaimer, the term of this patent is extended or adjusted under 35 U.S.C. 154(b) by 111 days.

(21) Appl. No.: 16/516,240

(22) Filed: Jul. 18, 2019

(65) Prior Publication Data
US 2019/0339140 A1 Nov. 7, 2019

Related U.S. Application Data

(62) Division of application No. 15/240,772, filed on Aug. 18, 2016, now Pat. No. 10,359,324.

(51) Int. Cl.
*G01L 1/12* (2006.01)
*G01L 3/10* (2006.01)
(Continued)

(52) U.S. Cl.
CPC ............... *G01L 1/127* (2013.01); *G01L 1/12* (2013.01); *G01L 3/101* (2013.01); *G01L 3/102* (2013.01);
(Continued)

(58) Field of Classification Search
CPC ...... G01L 1/127; G01F 27/2804; H01F 38/20; H05K 1/18; H05K 2201/1003
(Continued)

(56) References Cited

U.S. PATENT DOCUMENTS 4,920,806 A * 5/1990 Obama .................... G01B 7/24
324/209
5,351,555 A 10/1994 Garshelis
(Continued)

FOREIGN PATENT DOCUMENTS

DE 147 581 A1 4/1981
DE 199 29 864 A1 1/2001
(Continued)

OTHER PUBLICATIONS

Extended European Search Report and Opinion issued in connection with correspondong EP Application No. 16199480.1 dated Jun. 20, 2017.

*Primary Examiner* — Nathaniel T Woodward
(74) *Attorney, Agent, or Firm* — Mintz Levin Cohn Ferris Glovsky and Popeo, PC; Lisa Adams

(57) ABSTRACT

A sensor for sensing stress in a ferromagnetic material includes a non-magnetic substrate. The substrate has a first surface and a second surface opposite the first surface. A first coil is attached to or formed on the first surface of the substrate. The first coil is configured to induce a magnetic flux in the ferromagnetic material being driven by an alternating current (AC) signal. At least one second coil is attached to or formed on the first surface of the substrate. The at least one second coil is spaced from the first coil. In addition, the second coil is configured to detect changes in the magnetic flux induced in the ferromagnetic material.

5 Claims, 11 Drawing Sheets

(51) Int. Cl.
*H01L 41/12* (2006.01)
*H01F 27/28* (2006.01)
*H01F 38/20* (2006.01)
*H05K 1/18* (2006.01)

(52) U.S. Cl.
CPC ......... *H01F 27/2804* (2013.01); *H01F 38/20* (2013.01); *H01L 41/125* (2013.01); *H05K 1/18* (2013.01); *H05K 2201/1003* (2013.01)

(58) Field of Classification Search
USPC ........................................................ 73/779
See application file for complete search history.

(56) References Cited

U.S. PATENT DOCUMENTS

| | | | |
|---|---|---|---|
| 5,659,248 A * | 8/1997 | Hedengren | G01N 27/82 324/232 |
| 6,912,911 B2 | 7/2005 | Oh et al. | |
| 7,302,864 B2 | 12/2007 | Liu et al. | |
| 8,015,886 B2 | 9/2011 | Lohr et al. | |
| 8,087,304 B2 | 1/2012 | Lee | |
| 8,378,435 B2 * | 2/2013 | Lo | G01L 19/147 257/415 |
| 9,217,682 B2 | 12/2015 | Brummel et al. | |
| 9,429,488 B2 * | 8/2016 | Lu | G01L 1/125 |
| 2004/0112146 A1 | 6/2004 | Islam et al. | |
| 2009/0145239 A1 | 6/2009 | Girshovich et al. | |
| 2010/0301846 A1 | 12/2010 | Lee | |
| 2013/0181702 A1 | 7/2013 | May | |
| 2013/0291657 A1 | 11/2013 | Purekar et al. | |
| 2014/0102220 A1 | 4/2014 | Brummel et al. | |
| 2014/0152236 A1 | 6/2014 | Garshelis et al. | |
| 2014/0165741 A1 | 6/2014 | Sihler et al. | |
| 2014/0174203 A1 | 6/2014 | Hassel et al. | |
| 2014/0182388 A1 | 7/2014 | Sipila et al. | |
| 2014/0184210 A1 | 7/2014 | Campbell et al. | |
| 2014/0339653 A1 | 11/2014 | Chang et al. | |
| 2015/0323397 A1 | 11/2015 | May | |

FOREIGN PATENT DOCUMENTS

| | | |
|---|---|---|
| EP | 2259074 A2 | 12/2010 |
| EP | 2697618 A1 | 2/2014 |
| EP | 2707679 A1 | 3/2014 |
| IN | 3142/KOLNP/2013 | 11/2014 |
| JP | 2011203175 A | 10/2011 |
| JP | 5428026 B2 | 2/2014 |
| WO | 2012152515 A1 | 11/2012 |
| WO | 2012152720 A1 | 11/2012 |
| WO | 2013023699 A1 | 2/2013 |
| WO | 2014090970 A1 | 6/2014 |

\* cited by examiner

NON-CONTACT MAGNETOSTRICTIVE SENSORS AND METHODS OF OPERATION OF SUCH SENSORS

CROSS-REFERENCE TO RELATED APPLICATIONS

This application is a divisional of U.S. patent application Ser. No. 15/240,772, filed on Aug. 18, 2016, and entitled "Non-Contact Magnetostrictive Sensors And Methods Of Operation Of Such Sensors," the entirety of which is hereby incorporated by reference.

BACKGROUND

The subject matter described herein relates generally to stress sensing in ferromagnetic materials, and more particularly, to non-contact sensors, systems, and methods for the sensing of stress in ferromagnetic materials.

Most known ferromagnetic materials have a magnetostrictive property that induces the materials to change shape in the presence of an applied magnetic field. The inverse is also true, i.e., when a force is induced on a ferromagnetic material, the magnetic properties, such as the magnetic permeability, of the material change. A magnetostrictive sensor senses the changes in magnetic permeability and, because the changes are proportional to the amount of stress applied to the ferromagnetic material, the resulting measurements are used to calculate the amount of stress.

The changes in the magnetic permeability due to stress applied to the ferromagnetic material, however, is small, making accurate measurement difficult. At least some known magnetostrictive sensors are used with a ferromagnetic material that has had a magnetic field permanently induced in at least a portion of the material to facilitate measuring the stress in the material. This feature requires magnetically encoding the material to be sensed. Such an operation is typically expensive and not all materials will retain their magnetization over long periods. In addition, such an operation makes it more difficult to retrofit existing systems with a magnetostrictive sensing system because the material to be sensed, e.g. a shaft of a gas turbine, has to be temporarily removed from the system to undergo permanent magnetic encoding. In at least some other known magnetostrictive sensing systems, a pre-conditioning magnetic flux device is used to induce a conditioning magnetic flux into the material to be sensed and a separate magnetic field detector senses transient changes to the magnetic field. At least some of these systems make it more difficult to retrofit existing apparatus or machines with a magnetostrictive sensing system because of the need for multiple devices. In addition, at least some known magnetostrictive sensors use special ferrite core designs and require use of specialized winding-machines during manufacturing of the sensors. This leads to increased manufacturing costs as well as increased size of the sensors.

SUMMARY

In one aspect, a sensor for sensing stress in a ferromagnetic material is provided. The sensor includes a non-magnetic substrate comprising a first surface and a second surface opposite the first surface. In addition, the sensor includes a first coil coupled to the first surface. The first coil is configured to induce a magnetic flux in the ferromagnetic material. The first coil is also configured to be driven by an alternating current (AC) signal. Moreover, the sensor includes at least one second coil coupled to the first surface. The at least one second coil is spaced from the first coil and is configured to detect changes in the magnetic flux induced in the ferromagnetic material.

In another aspect, a sensor for sensing stress in a ferromagnetic material is provided. The sensor includes a non-magnetic substrate extending in a first, second, and third direction. The substrate includes a first layer including a first bottom surface and a first top surface opposite the first bottom surface. The first bottom surface extends along the first direction and the second direction. The substrate also includes a second layer including a second bottom surface and a second top surface opposite the second bottom surface. The second top surface is coupled to the first bottom surface. The second bottom surface extends along the first direction and the second direction. The sensor includes a first coil coupled to the second bottom surface. The first coil is configured to induce a magnetic flux in the ferromagnetic material and is configured to be driven by an alternating current (AC) signal. The sensor also includes a second coil coupled to the first bottom surface. The second coil is positioned to overlap at least a portion of the first coil in at least one of the first and second directions. The second coil is configured to detect changes in the magnetic flux induced in the ferromagnetic material.

In another aspect, a method for measuring stress in a ferromagnetic material is provided. The method includes inducing a first magnetic flux in the ferromagnetic material using a first coil. The method also includes detecting changes in the first magnetic flux using a second coil and a third coil. The method includes correlating the changes in the first magnetic flux to the stress in the ferromagnetic material. In addition, the method includes inducing a second magnetic flux in the ferromagnetic material using the second coil and detecting changes in the second magnetic flux using the first and third coils. The method includes correlating the changes in the second magnetic flux to the stress in the ferromagnetic material. Moreover, the method includes inducing a third magnetic flux in the ferromagnetic material using the third coil and detecting changes in the third magnetic flux using the first and second coils. The method includes correlating the changes in the third magnetic flux to the stress in the ferromagnetic material.

DESCRIPTION OF DRAWINGS

These and other features, aspects, and advantages of the present disclosure will become better understood when the following detailed description is read with reference to the accompanying drawings in which like characters represent like parts throughout the drawings, wherein.

Unless otherwise indicated, the drawings provided herein are meant to illustrate features of embodiments of the disclosure. These features are believed to be applicable in a wide variety of systems comprising one or more embodiments of the disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value. Here and throughout the specification and claims, range limitations may be combined and/or interchanged; such ranges are identified and include all the sub-ranges contained therein unless context or language indicates otherwise.

As used herein, the terms "processor" and "computer," and related terms, e.g., "processing device," "computing device," and "controller" are not limited to just those integrated circuits referred to in the art as a computer, but broadly refers to a microcontroller, a microcomputer, a programmable logic controller (PLC), and application specific integrated circuit, and other programmable circuits, and these terms are used interchangeably herein.

As used herein, the phrase "ferromagnetic material" includes both ferromagnetic and ferrimagnetic material. Moreover, as used herein, the phrase "magnetic permeability" refers to the ability of a material to support formation of a magnetic field within itself. In particular, magnetic permeability is a constant of proportionality that occurs between magnetic induction and magnetic field intensity, i.e., the relative increase or decrease in a magnetic flux inside a material as compared to a magnetic field applied to the material.

Figure 1:
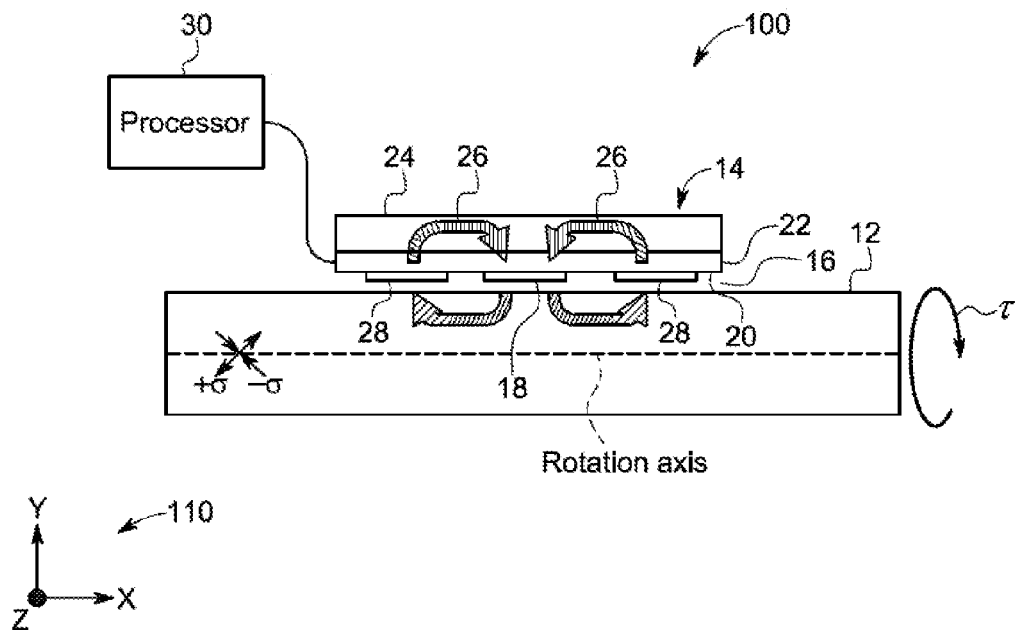
FIG. 1 is a schematic view of a stress sensing system for sensing the stress in a ferromagnetic material, such as a rotatable shaft.

FIG. 1 is a schematic view of a stress sensing system 100 for sensing the stress in a ferromagnetic material 12, such as a rotatable shaft. Stress sensing system 100 includes a sensor head 14 positioned proximate to ferromagnetic material 12 with a gap 16 defined between sensor head 14 and ferromagnetic material 12. Sensor head 14 is typically coupled to a frame or fixture (not shown) to maintain the sensor head 14 in a proper orientation and at a proper gap 16. In addition, generally, sensor head 14 includes electrical coupling to a power supply (not shown) for supplying the current necessary to generate the magnetic flux used for sensing the stress in ferromagnetic material 12. To facilitate the discussion of sensor head 14, and the various embodiments of sensor heads described herein, a coordinate system 110 is shown with an x-axis, y-axis, and z-axis, each axis orthogonal to the other two axes. For reference, ferromagnetic material 12, or the rotatable shaft, is shown oriented with the rotation axis extending parallel to the x-axis and orthogonal to the other two axes.

In the exemplary embodiment, sensor head 14 includes a planar excitation coil 18 that is formed on a bottom surface 20 of a non-magnetic substrate 22. Substrate 22 is fabricated from an insulative material, for example, without limitation, a printed circuit board (PCB) material such as polyimide, cotton paper, or woven glass and epoxy. In the exemplary embodiment, substrate 22 is a PCB having the excitation coil 18 supported or formed thereon using typical PCB forming techniques. Substrate 22 is fabricated such that it facilitates flexing and bending of substrate 22. Excitation coil 18 is fabricated from a conductive material, for example, and without limitation, copper or aluminum. In some embodiments, excitation coil 18 is fabricated solely from a conductive material. The conductive material is cut, etched, or similarly manipulated in order to achieve a desired shape and size on substrate 22. In some embodiments, excitation coil 18 is prefabricated before being bonded to substrate 22. In other embodiments, a sheet of the conductive material is bonded to substrate 22 and subsequently cut, etched, or similarly manipulated to achieve the desired shape and size of excitation coil 18 on substrate 22.

Sensor head 14 includes a ferromagnetic material backplane or core 24 that facilitates concentrating the magnetic field generated by excitation coil 18. Core 24 is fabricated from a ferromagnetic material, for example, and without limitation, a ferrite or iron. In some embodiments, core 24 is fabricated from a sheet of ferromagnetic material and is bonded to substrate 22. Core 24 is fabricated such that it facilitates flexing and bending of substrate 22. In other embodiments, substrate 22 (or the PCB) is coupled to core 24. For example, and without limitation, in some embodiments, core 24 is commercial off-the-shelf (COTS) core having substrate 22 bonded directly thereto.

Advantages of core 24 include increasing the efficiency of sensor head 14 by increasing the amount of magnetic field generated by excitation coil 18. However, core 24 also has the disadvantage of increasing the manufacturing cost by adding an additional component to sensor head 14. In addition, some ferromagnetic materials used for core 24 lose their magnetic properties at increased temperatures, for example, and without limitation, more than 150° Celsius (302° Fahrenheit). Thus, to reduce the cost of sensor head 14, or when using sensor head 14 in a higher temperature application, in some embodiments, core 24 is omitted from sensor head 14. In applications with lower temperatures, for example, and without limitation, less than 150° Celsius, core 24 is used to increase the efficiency of sensor head 14.

In the exemplary embodiment, excitation coil 18 is configured to be driven by an alternating current (AC) signal passed through it to induce a magnetic flux 26 in ferromagnetic material 12. Driving excitation coil 18 with an AC signal to induce magnetic flux 26 facilitates measuring both transient and steady state stress in ferromagnetic material 12. In an alternative embodiment, excitation coil 18 also has a direct current (DC) signal passed through it simultaneously with an AC signal to induce a conditioning magnetic flux in ferromagnetic material 12.

Also, in the exemplary embodiment, magnetic flux 26 permeates ferromagnetic material 12 and returns to excitation coil 18 such that one or more detectors 28 measure magnetic flux 26. The permeability for regions of ferromagnetic material 12 change because of stresses applied to the material. Detectors 28 are configured to transmit a signal (not shown) indicative of these changes. For example, and without limitation, a detector 28 transmits a signal indicative of changes in magnetic flux 26 to a processor 30.

Further, in the exemplary embodiment, detector 28 is a planar coil that is formed or supported on bottom surface 20 of substrate 22. Detector 28, like excitation coil 18, is fabricated from a conductive material, for example, and without limitation, copper or aluminum. In some embodiments, detector 28 is fabricated solely from a conductive material. The conductive material is cut, etched, or similarly manipulated in order to achieve a desired shape and size on substrate 22. In some embodiments, detector 28 is prefabricated before being bonded to substrate 22. In other embodiments, a sheet of the conductive material is bonded to substrate 22 and subsequently cut, etched, or similarly manipulated to achieve the desired shape and size of detector 28 on substrate 22.

In some embodiments of sensor head 14, the coils forming excitation coil 18 and detector 28 have at least two functions. The coils operate simultaneously as an excitation coil, such as excitation coil 18, and a detection coil, such as detector 28. In such embodiments, the coils can be driven simultaneously by both an AC and a DC signal. In addition, in some such embodiments, an AC source simultaneously transmits AC signals to the coils at two or more different frequencies.

In alternative embodiments, detector 28 is based on several types of magnetic field sensors (magnetometers) including, without limitation, magnetoresistive, flux gate, Hall Effect, and magnetoinductive sensors. Selection of a specific magnetic field sensor depends upon certain characteristics, such as, without limitation, flux density, resolution, accuracy, and number of magnetic axes.

In the exemplary embodiment, processor 30 processes the signals received from detector 28 using standard electronics, e.g., without limitation, an amplifier and a filter (neither shown). The signals received from detector 28 are communicated by one or more wire or wireless methods. In some embodiments, wireless communication devices such as radio transmitters (not shown) are integrated within stress sensing system 100 and mounted about sensor head 14 to transmit the signals to a receiver (not shown) of processor 30. In the exemplary embodiment, processor 30 is any known processor, for example, and without limitation, a microprocessor (digital or analog) or other computing device. In some embodiments, processor 30 is co-located with sensor head 14, and in other embodiments, processor 30 is located separate from sensor head 14.

In some alternative embodiments, additional sensors (not shown), for example, proximity sensors, magnetometers, or temperature sensors, are positioned proximate ferromagnetic material 12. Proximity sensors are used to monitor gap 16 defined between ferromagnetic material 12 and sensor head 14. In some embodiments, additional magnetometers are used to monitor background magnetic fields, for example, and without limitation, the earth's magnetic field and extraneous electromagnetic interference (EMI). In addition, in some embodiments, temperature sensors are used to monitor temperature changes. Gap changes, temperature changes, and background EMI affect the signal received by detectors 28. By monitoring gap 16, temperature changes, and background EMI, processor 30 facilitates reducing the magnitude of the assorted effects on the signals.

In operation, detectors 28 measure a change in magnetic field strength in ferromagnetic material 12 proximate sensor head 14. The measurements of detectors 28 are transmitted to processor 30 and then to a programmable logic unit (not shown) located away from ferromagnetic material 12. The programmable logic unit is configured to process the signals received from sensor head 14 to obtain a measurement of the stress in ferromagnetic material 12.

With reference to FIG. 1, in the exemplary embodiment, a torque τ is induced to rotatable shaft 12. Torque τ induces stress along a direction offset ±45° from the rotation axis of rotatable shaft 12. This stress includes both a compressive stress −σ and a tensile stress +σ. The magnetic permeability of rotatable shaft 12 is different in the direction of compressive stress compared with the direction of tensile stress. Sensor head 14 is configured to sense the difference in magnetic permeability. In the exemplary embodiment, torque τ is a force applied to rotatable shaft 12. Other external forces, however, can be applied to rotatable shaft 12 and sensed by stress sensing system 100.

Figure 2:
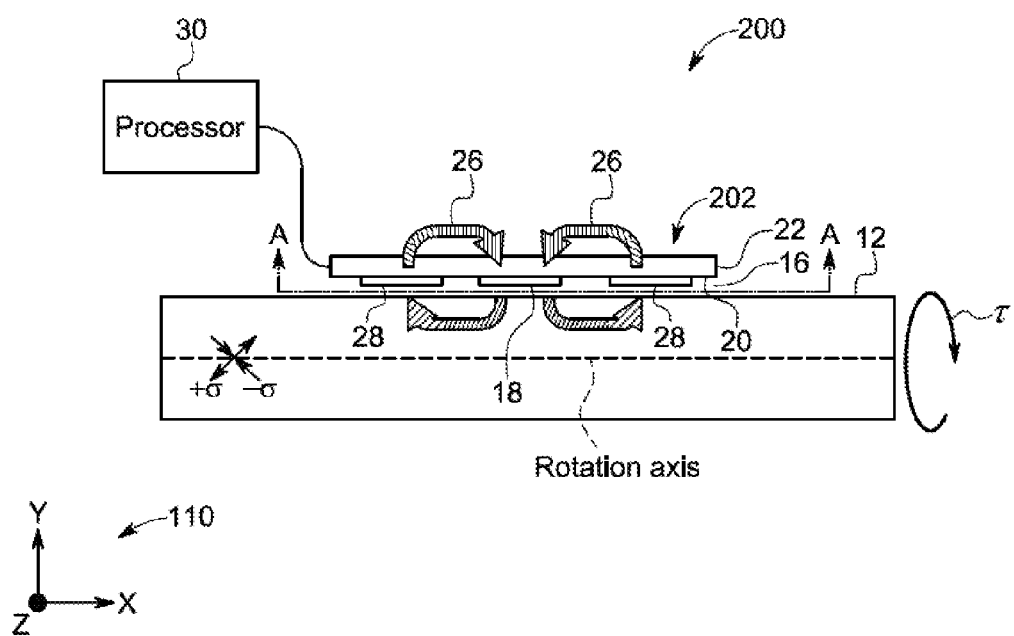
FIG. 2 is a schematic view of an alternative stress sensing system.

FIG. 2 is a schematic view of an alternative stress sensing system 200. In this embodiment, a sensor head 202 is formed substantially the same as sensor head 14 (shown in FIG. 1), except core 24 is omitted from sensor head 202. As described herein, core 24 increases manufacturing costs by adding an additional component to sensor head 14. In addition, some ferromagnetic materials used to fabricate core 24 lose their magnetic properties at increased temperatures, for example, and without limitation, greater than 150° C. (302° F.). Thus, to reduce the cost of sensor head 14, or when using sensor head 14 in a higher temperature application, core 24 is omitted from sensor head 202.

Figure 3:
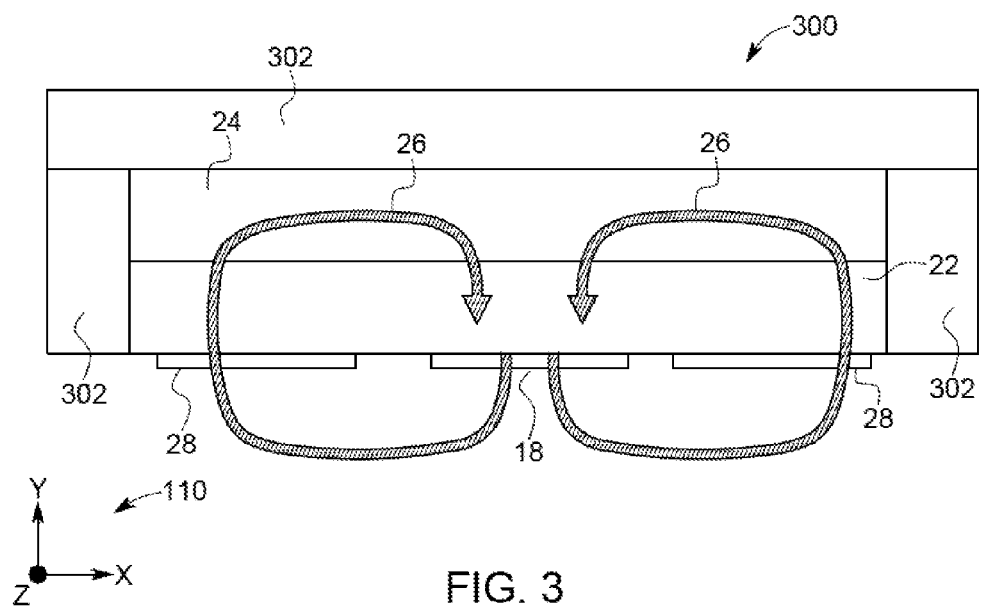
FIG. 3 is an enlarged schematic view of a sensor head that may be used with the stress sensing system shown in FIG. 1.

FIG. 3 is an enlarged schematic view of a sensor head 300 that may be used with stress sensing system 100 (shown in FIG. 1). In the exemplary embodiment, sensor head 300 includes a layer of shielding material 302, for example, and without limitation, copper and aluminum, coupled to core 24 opposite substrate 22. In addition, shielding material 302 is coupled about a periphery of substrate 22 and core 24, and more particularly, about a periphery of excitation coil 18 and detectors 28. Shielding material 302 is configured to facilitate shielding magnetic flux 26, thus, the path of magnetic flux 26 is shielded from external influences by a perimeter and an additional backplane of shielding material 302. This facilitates reducing an amount of electromagnetic interference that is sensed by sensor head 14. The additional backplane of shielding material 302 is fabricated from a sheet of shielding material and is bonded to substrate 22 and/or core 24. The shielding material 302 surrounding excitation coil 18 and detectors 28 is cut, etched, or similarly manipulated in order to achieve a desired shape and size on substrate 22. In some embodiments, the shielding material 302 is prefabricated before being bonded to substrate 22. In other embodiments, a sheet of the conductive material is bonded to substrate 22 and subsequently cut, etched, or similarly manipulated to achieve the desired shape and size on substrate 22.

Figure 4:
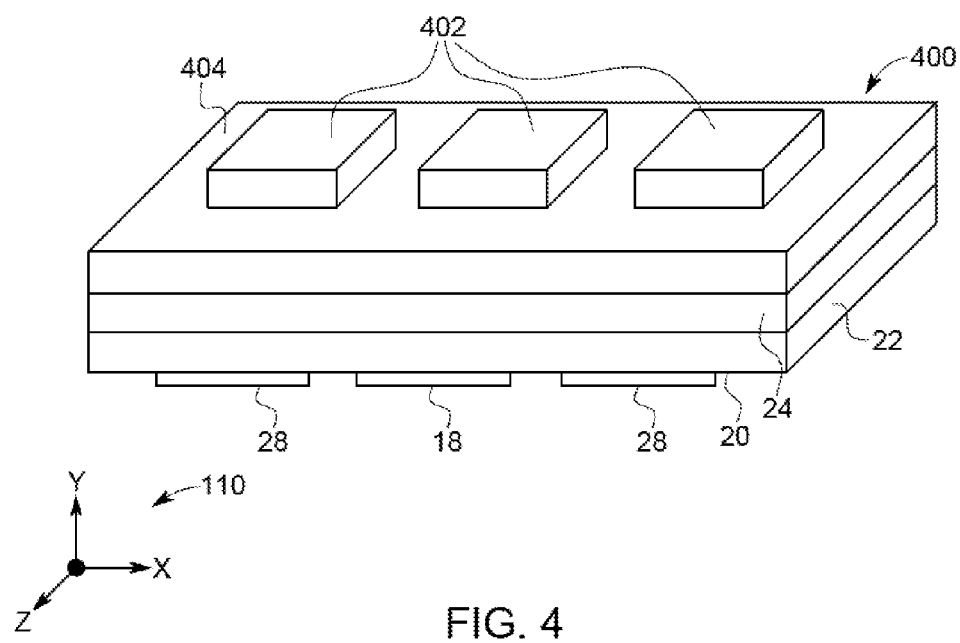
FIG. 4 is a schematic isometric view of an alternative sensor head for use with the stress sensing system shown in FIG. 1.

FIG. 4 is a schematic isometric view of an alternative sensor head 400 for use with stress sensing system 100 (shown in FIG. 1). In this alternative embodiment, sensor head 400 is formed similarly to sensor head 14 (shown in FIG. 1). Sensor head 400 includes excitation coil 18 formed on bottom surface 20 of substrate 22. Substrate 22 is fabricated from a PCB material, as described herein. In this alternative embodiment, sensor head 400 includes core 24 fabricated from a ferromagnetic material, for example ferrite and iron. Alternatively, in alternative embodiments, core 24 is omitted from sensor head 400. In this alternative embodiment, sensor head 400 also includes one or more detectors 28 configured to measure magnetic flux generated by excitation coil 18. Detectors 28 are configured to transmit a signal (not shown) indicative of these changes to electronics 402.

In this alternative embodiment, electronics 402 are formed on a substrate 404, which is coupled to core 24 opposite substrate 22. Substrate 404 is fabricated from a PCB material, as described herein, and facilitates bending and flexing of substrate 404. In this alternative embodiment, electronics 402 include, for example, and without limitation, amplifiers, filters, and oscillators, for processing the signals received from detectors 28. In addition, in some embodiments, electronics 402 include sensors and other electronic components, for example, and without limitation, sensors, proximity sensors, and magnetometers. The signals received from detectors 28 are communicated by wire or wireless methods. Wireless communication devices such as radio transmitters (not shown) are integrated within stress sensing system 100 and mounted about sensor head 400 to transmit the signals to electronics 402.

Figure 5:
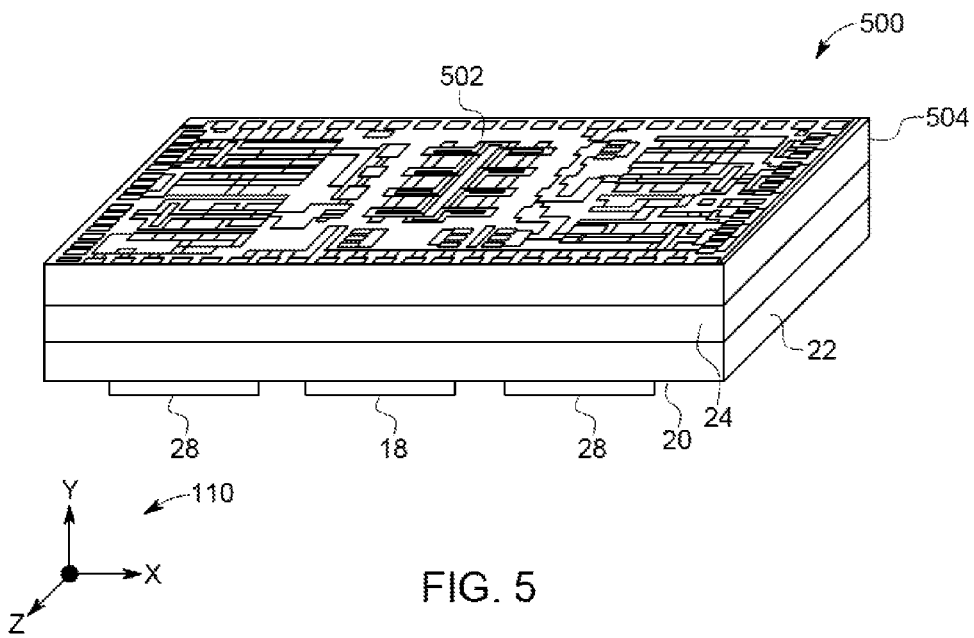
FIG. 5 is a schematic isometric view of another alternative sensor head for use with the stress sensing system shown in FIG. 1.

FIG. 5 is a schematic isometric view of an alternative sensor head 500 for use with stress sensing system 100 (shown in FIG. 1). In this alternative embodiment, sensor head 500 is formed as a system on a chip. Sensor head 500 is formed as a single chip, or formed on a larger substrate with one or more active chips bonded thereto. Sensor head 500 includes excitation coil 18 formed on bottom surface 20 of substrate 22. In this alternative embodiment, sensor head 500 includes core 24 fabricated from a ferromagnetic material, for example ferrite and iron. Alternatively, in some embodiments, core 24 is omitted from sensor head 500. Sensor head 500 also includes one or more detectors 28 configured to measure magnetic flux generated by excitation coil 18. Detectors 28 are configured to transmit a signal (not shown) indicative of these changes to processor 502.

In this alternative embodiment, processor 502 is an integrated circuit device that includes a substrate 504, which is coupled to core 24 opposite substrate 22. Substrate 504 is fabricated from a generally rigid material such as silicon. Processor 502 is configured to process the signals received from detectors 28. The signals received from detectors 28 are communicated by wire or wireless methods. Wireless communication devices such as radio transmitters (not shown) are integrated within stress sensing system 100 and mounted about sensor head 500 to transmit the signals to processor 502.

Figure 6:
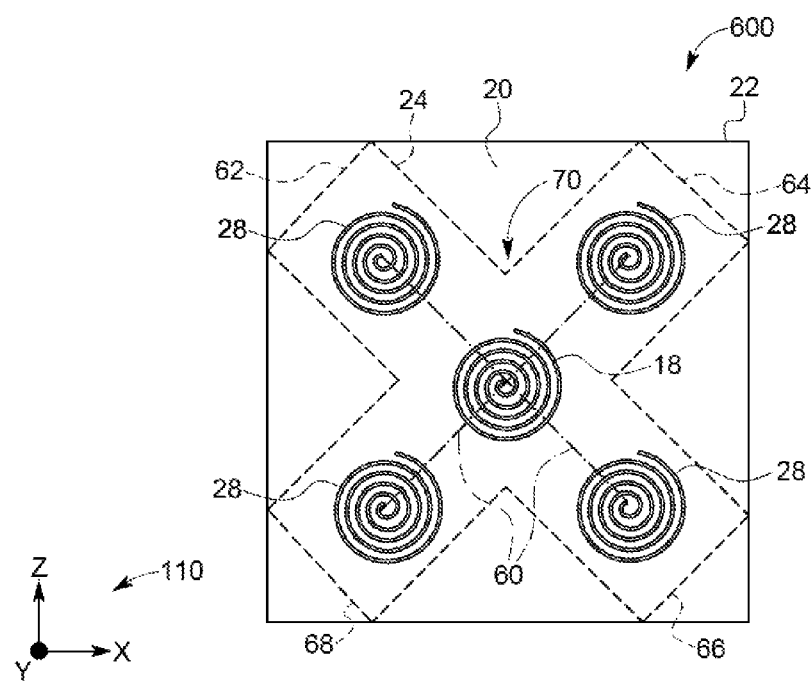
FIG. 6 is a schematic plan view of a sensor head looking toward a bottom surface of a substrate, as shown by line A-A shown in FIG. 2.

FIG. 6 is a schematic plan view of an alternative sensor head 600 looking toward bottom surface 20 of substrate 22, as shown for example by line A-A (shown in FIG. 2). In this alternative embodiment, sensor head 600 is configured for measuring both steady state and transient torque in ferromagnetic material 12, such as a rotatable shaft. While substrate 22 is shown having a generally square shape, it is noted that substrate 22 is fabricated in any shape that enables sensor head 600 to function as described herein. For example, and without limitation, in some embodiments, substrate 22 is generally circular in shape. In this alternative embodiment, the excitation coil 18 and detectors 28 are positioned in a cross-axis configuration. Excitation coil 18 is located generally at the center of substrate 22. Each of detectors 28 is located adjacent excitation coil 18 and spaced at a distance that is substantially the same as each other detector 28. In this alternative embodiment, four detectors 28 are shown; however, substrate 22 can have any number of detectors 28 that enables sensor head 600 to function as described herein. Each detector 28 is spaced from an adjacent detector 28 at an angle of approximately 90° with respect to a center of excitation coil 18, as generally indicated by center lines 60.

In this alternative embodiment, sensor head 600 includes core 24 formed on a surface of substrate 22 opposite bottom surface 20. Core 24 is fabricated from any ferromagnetic material, for example, and without limitation, iron or ferrite. Core 24 includes a cross-axis configuration, including four members 62, 64, 66, and 68 that extend planarly outward from a central portion, generally indicated at 70. The four members 62, 64, 66, and 68 are substantially orthogonal to each other around central portion 70. Furthermore, each of the four members 62, 64, 66, and 68 terminates in an end distal from central portion 70. In alternative embodiments, core 24 can have any number of members and any configuration that permits core 24 to operate as described herein. For example, and without limitation, in one embodiment, core 24 has the shape of substrate 22, thereby covering the entire surface of substrate 22 opposite bottom surface 20. Furthermore, each member extends from central portion 70 in any configuration and for any length that permits each member to operate as described herein. A respective detector 28 is formed in substrate 22 corresponding to a location of respective members 62, 64, 66, and 68.

Also, in this alternative embodiment, during operation, an AC signal is passed through excitation coil 18 to induce magnetic flux 26 in rotatable shaft or ferromagnetic material 12. Magnetic flux 26 flows from the excitation coil 18, through rotatable shaft 12, and returns through members 62, 64, 66, and 68 of core 24. Detectors 28 sense an amount of returning magnetic flux 26.

Figure 7:
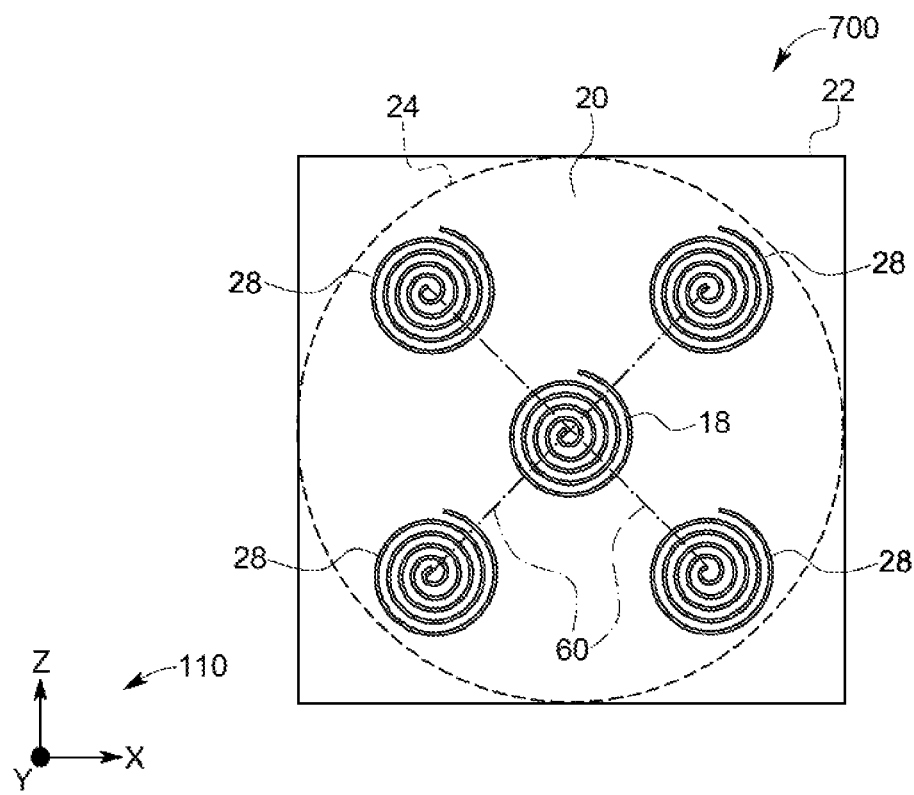
FIG. 7 is a schematic plan view of an alternative sensor head looking toward a bottom surface of a substrate, as shown by line A-A shown in FIG. 2.

FIG. 7 is a schematic plan view of an alternative sensor head 700 looking toward bottom surface 20 of substrate 22, as shown for example by line A-A (shown in FIG. 2). In this alternative embodiment, sensor head 700 includes core 24 formed on a surface of substrate 22 opposite bottom surface 20. Core 24 is circular in shape, and extends beyond detectors 28. Core 24 facilitates magnetic flux 26 flowing from excitation coil 18, through rotatable shaft 12, and returning through core 24. Detectors 28 sense an amount of returning magnetic flux 26.

Figure 8:
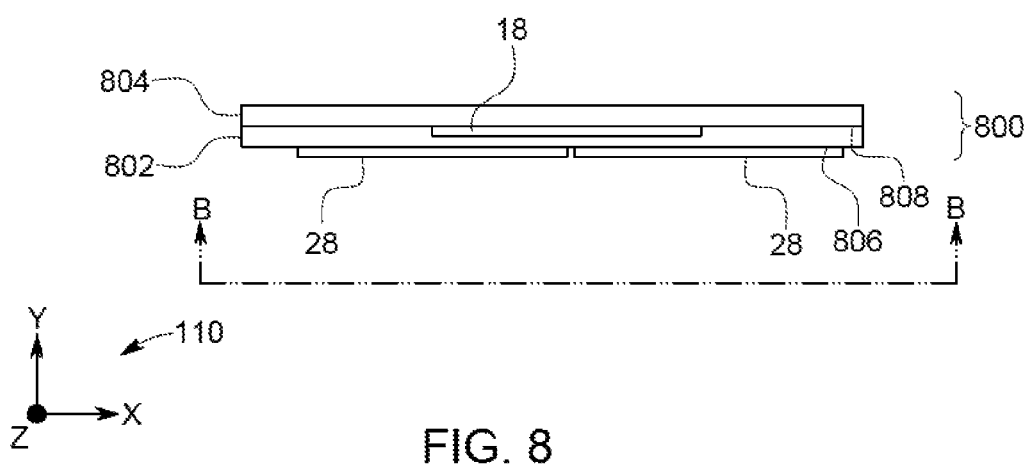
FIG. 8 is a schematic view of an alternative sensor substrate for use in the stress sensing system shown in FIG. 1.

FIG. 8 is a schematic view of an alternative sensor substrate 800 for use in stress sensing system 100 (shown in FIG. 1). Sensor head 14 (shown in FIG. 1) includes excitation coil 18 and detector coils 28 located on bottom surface 20 of a single layer substrate 22 or PCB. In this alternative embodiment, sensor substrate 800 is a multi-layer substrate. Sensor substrate 800 includes two layers stacked and bonded together to form sensor substrate 800, for example, layer 802 and layer 804. Alternatively, sensor substrate 800 includes more than two layers. In this alternative embodiment, each of layers 802 and 804 are fabricated from a PCB material, as described herein, and facilitates bending and flexing of sensor substrate 800. In the exemplary embodiment, sensor substrate 800 is a PCB having excitation coil 18 supported or formed on layers 804 of the PCB using typical PCB forming techniques. Excitation coil 18 is formed on a bottom surface 808 of layer 804. Excitation coil 18 is fabricated from a conductive material, for example, and without limitation, copper and aluminum. In some embodiments, excitation coil 18 is fabricated solely from a conductive material. The conductive material is cut, etched, or similarly manipulated in order to achieve a desired shape and size on layer 804. In alternative embodiments where sensor substrate 800 has more than two layers, excitation coils 18 are formed on at least two layers, are substantially the same size and shape, and are generally vertically aligned. In such an embodiment, excitation coils 18 are electrically coupled using a vertical interconnect access or via (not shown) extending between the two or more layers of sensor substrate 800.

In some embodiments, excitation coil 18 is prefabricated before being bonded to layer 804. In other embodiments, a sheet of the conductive material is bonded to layer 804 and subsequently cut, etched, or similarly manipulated to achieve the desired shape and size of excitation coil 18. Layer 804 is subsequently bonded to layer 802 to form at least a portion of sensor substrate 800.

In this alternative embodiment, sensor substrate 800 includes a plurality of detectors 28. Each detector 28 is a coil that is formed or supported on layer 802 of sensor substrate 800. At least two detectors 28 are formed on a bottom surface 806 of layer 802. Layer 802 is fabricated from a PCB material, as described herein, and facilitates bending and flexing of sensor substrate 800. Detectors 28, like excitation coil 18, are fabricated from a conductive material, for example, and without limitation, copper and aluminum. In some embodiments, detectors 28 are fabricated solely from a conductive material. The conductive material is cut, etched, or similarly manipulated in order to achieve a desired shape and size on the layer 802. In this alternative embodiment, detectors 28 are substantially the same size and shape. In alternative embodiments where sensor substrate 800 has more than two layers, detectors 28 are formed on at least two layers, are substantially the same size and shape, and are generally vertically aligned with respective detectors 28 formed on layer 802. In such an embodiment, detectors 28 are electrically coupled using a via (not shown) extending between the two or more layers of sensor substrate 800.

In some embodiments, detectors 28 are prefabricated before being bonded to layer 802. In other embodiments, a sheet of the conductive material is bonded to layer 802, and subsequently cut, etched, or similarly manipulated to achieve the desired shape and size of detectors 28. Layer 802 is subsequently bonded to layer 804 to form at least a portion of sensor substrate 800.

Figure 9:
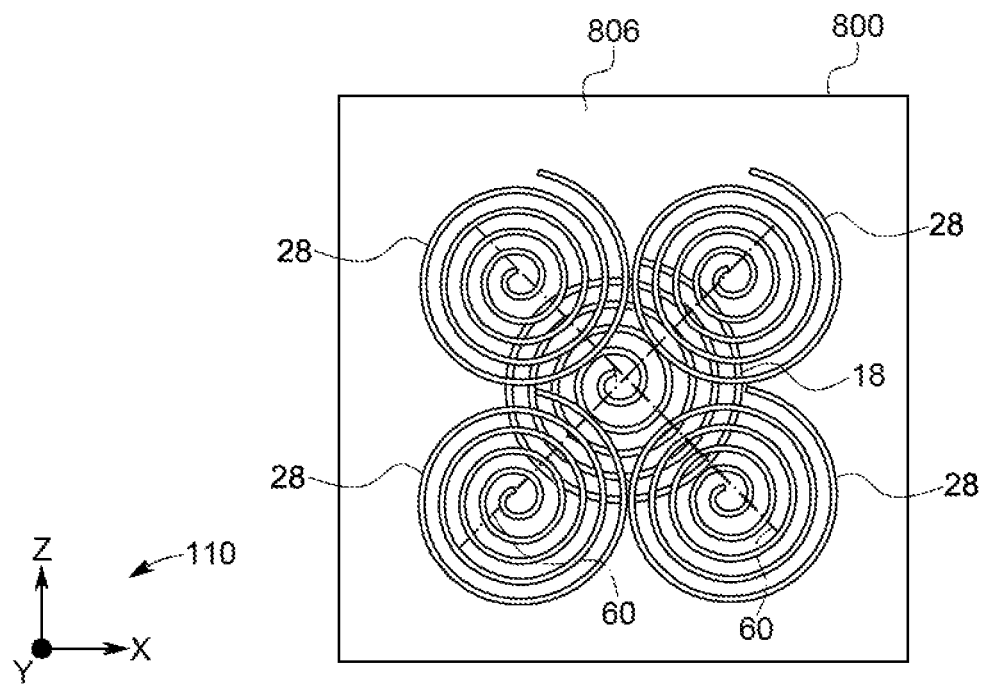
FIG. 9 is a schematic plan view of the substrate of FIG. 8, looking toward a bottom surface of the substrate, as shown by line B-B shown in FIG. 8.

FIG. 9 is a schematic plan view of sensor substrate 800 looking toward bottom surface 806 of substrate 800, as shown by line B-B (shown in FIG. 8). In this embodiment, sensor substrate 800 is configured for measuring both steady state and transient torque in ferromagnetic material 12, such as a rotatable shaft (shown in FIG. 1). While sensor substrate 800 is shown having a generally square shape, it is noted that sensor substrate 800 is fabricated in any shape that enables sensor substrate 800 to function as described herein. For example, and without limitation, in some embodiments, sensor substrate 800 is generally circular in shape. In this alternative embodiment, excitation coil 18 and detectors 28 are positioned in a cross-axis configuration. Alternatively, excitation coil 18 and detectors 28 are positioned in any orientation that enables stress sensing system 100 to function as described herein. In the exemplary embodiment, excitation coil 18 is located generally at the center of sensor substrate 800. Each of detectors 28 is located such that they overlap at least a portion of excitation coil 18 in one or more of the X and Z directions of axes 110. In this alternative embodiment, four detectors 28 are shown; however, in alternative embodiments, sensor substrate 800 has any number of detectors 28 that enables stress sensing system 100 to function as described herein. In this alternative embodiment, each detector 28 is spaced from an adjacent detector 28 at an angle of approximately 90° with respect to a center of excitation coil 18, as generally indicated by center lines 60. While the coils of excitation coil 18 and detectors 28 are shown as being circular in shape, it is contemplated that the coils can have any shape.

Figure 10:
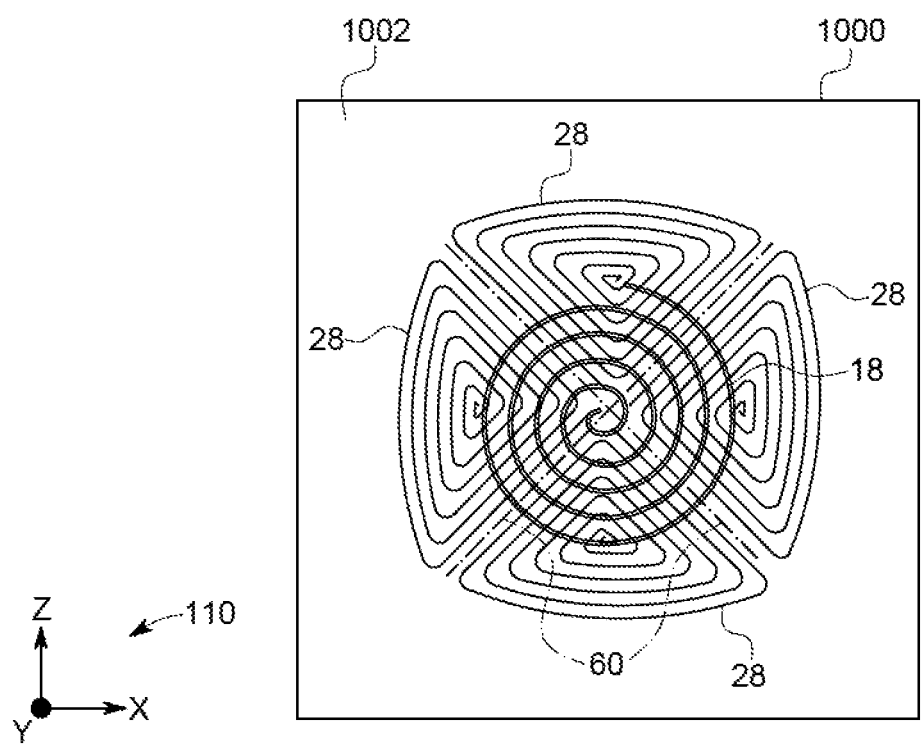
FIG. 10 is a schematic plan view of an alternative sensor substrate, looking toward a bottom surface of the sensor substrate, as shown by line B-B shown in FIG. 8.

FIG. 10 is a schematic plan view of an alternative sensor substrate 1000, looking toward a bottom surface 1002 of the sensor substrate 1000, as shown by line B-B (shown in FIG. 8). In this alternative embodiment, sensor substrate 1000 is fabricated substantially similar to sensor substrate 800. Detectors 28 are generally triangular shaped coils such that the combination of detectors 28 overlaps substantially the entire excitation coil 18 in the X and Z directions of axes 110.

In operation, at least a portion of magnetic flux 26 generated by excitation coil 18 couples to detectors 28 and does not extend into ferromagnetic material 12. Thus, an amount of magnetic flux 26 in ferromagnetic material 12 sensed by detectors 28 is different than an amount of magnetic flux 26 generated by excitation coil 18. An advantage of overlapping detectors 28 with excitation coil 18 is a reduction or suppression of the common-mode signal. That is, the amount of magnetic flux 26 that appears equally in excitation coil 18 and detectors 28 due to this coupling. Detectors 28 are configured, or balanced, such that zero total flux goes through them in a zero torque/stress situation of rotatable shaft 12. In addition, overlapping detectors 28 with excitation coil 18 facilitates increasing the sensitivity of the sensor head. As described herein, when a torque is applied to rotatable shaft 12, stress in the rotatable shaft includes both a compressive stress in one direction and a tensile stress in another direction. The magnetic permeability of rotatable shaft 12 is different in the direction of compressive stress compared with the direction of tensile stress. When the sensor is balanced and has zero total flux in a zero torque/stress, sensing a change in the magnetic permeability of rotatable shaft 12 by the sensor head is more easily achieved.

Figure 11:
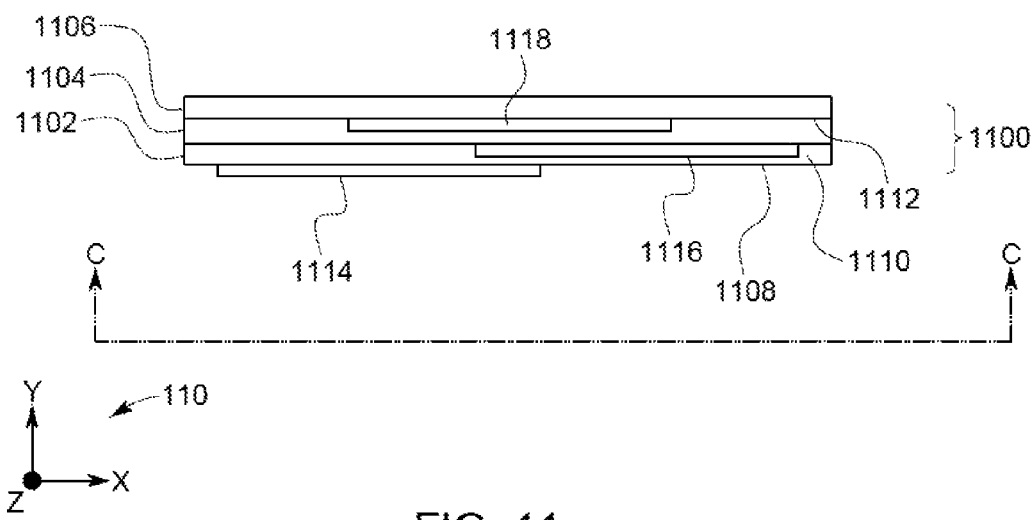
FIG. 11 is a schematic view of an alternative sensor substrate for use in the stress sensing system shown in FIG. 1.

FIG. 11 is a schematic view of an alternative sensor substrate 1100 for use in stress sensing system 100 (shown in FIG. 1). In this alternative embodiment, sensor substrate 1100 is a multi-layer substrate and includes three layers stacked and bonded together, for example, layer 1102, layer 1104, and layer 1106. Each of layers 1102, 1104, and 1106 are fabricated from a PCB material, as described herein, and facilitates bending and flexing of sensor substrate 1100. In the exemplary embodiment, sensor substrate 1100 is a PCB having a coil supported or formed on each of layers 1102, 1104, and 1106 of the PCB using typical PCB forming techniques. Coil 1114 is formed on a bottom surface 1108 of layer 1102, coil 1116 is formed on a bottom surface 1110 of layer 1104, and coil 1118 is formed on a bottom surface 1112 of layer 1106. Coils 1114, 1116, and 1118 are fabricated from a conductive material, for example, and without limitation, copper and aluminum. In some embodiments, coils 1114, 1116, and 1118 are fabricated solely from a conductive material. The conductive material is cut, etched, or similarly manipulated in order to achieve a desired shape and size on layers 1102, 1104, and 1106.

In some embodiments, coils 1114, 1116, and 1118 are prefabricated before being bonded to layers 1102, 1104, and 1106, respectively. In other embodiments, a sheet of the conductive material is bonded to layers 1102, 1104, and 1106 and subsequently cut, etched, or similarly manipulated to achieve the desired shape and size of coils 1114, 1116, and 1118. Layers 1102, 1104, and 1106 are subsequently bonded to each other to form at least a portion of sensor substrate 1100.

Figure 12:
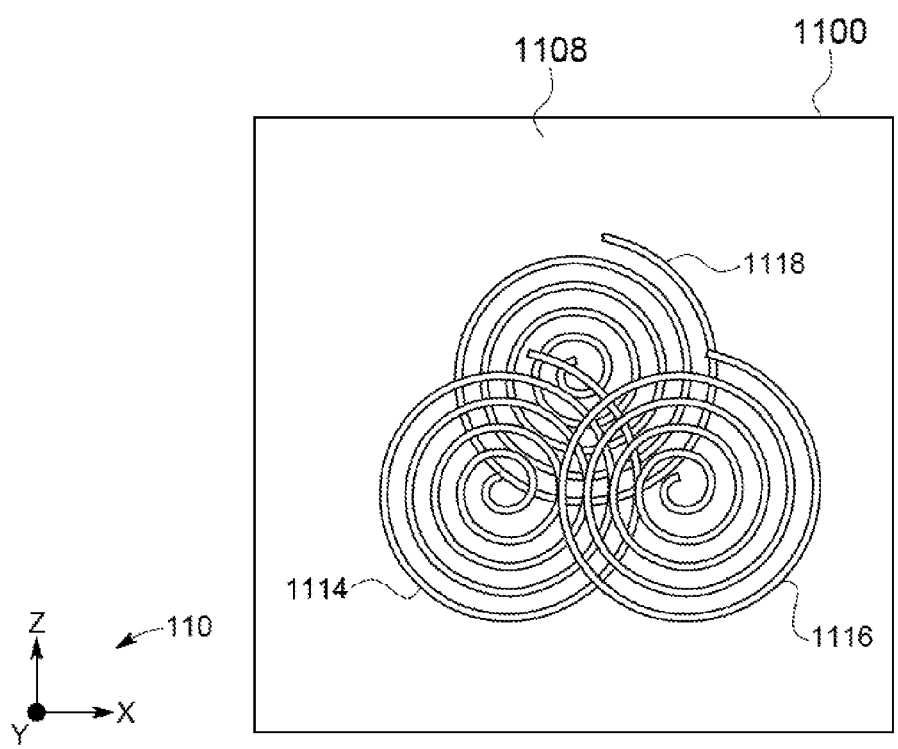
FIG. 12 is a schematic plan view of the alternative sensor substrate of FIG. 11, looking toward a bottom surface of the sensor substrate, as shown by line C-C shown in FIG. 11.

FIG. 12 is a schematic plan view of alternative sensor substrate 1100, looking toward bottom surface 1108 of sensor substrate 1100, as shown by line C-C (shown in FIG. 11). In this alternative embodiment, coils 1114, 1116, and 1118 are overlapping coils. For example, coil 1114 overlaps only a portion of coils 1116 and 1118; coil 1116 overlaps only a portion of coils 1118 and 1114, and thus, coil 1118 overlaps only a portion of coils 1114 and 1116. In this alternative embodiment, coils 1114, 1116, and 1118 have at least two functions. The coils operate simultaneously as an excitation coil, such as excitation coil 18, and a detection coil, such as detector 28. In such embodiments, the coils can be driven simultaneously by both an AC and a DC source. In addition, an AC source simultaneously transmits signals to coils 1114, 1116, and 1118 at two or more different frequencies.

The properties of rotatable shaft 12 are not homogeneous. In a zero torque situation, portions of rotatable shaft 12 have different properties due to the metallurgy of rotatable shaft 12 not being homogeneous, or, for example, and without limitation, there are different properties due to bending of the shaft, for example, because of gravity. It is difficult to resolve the stress and the orientation/proximity of the sensor. An advantage of arranging coils 1114, 1116, and 1118, as descried herein, facilitates providing at least three signal measures taken from different orientations to facilitate resolving the stress and the orientation/proximity of the sensor. In this alternative embodiment, coil 1114 functions as an excitation coil and coils 1116 and 1118 function as detectors. This enables stress sensing system 100 to determine at least some stress information about rotatable shaft 12. In addition, coil 1116 functions as an excitation coil and coils 1118 and 1114 function as detectors. This enables stress sensing system 100 to determine at least some additional stress information about rotatable shaft 12. Moreover, coil 1118 also functions as an excitation coil and coils 1114 and 1116 function as detectors. This enables stress sensing system 100 to determine additional information about rotatable shaft 12.

In this alternative embodiment, the functions of coils 1114, 1116, and 1118 are switched or multiplexed based on a time domain. For example, coil 1114 functions as an excitation coil and coils 1116 and 1118 function as detectors for a first period, coil 1116 functions as an excitation coil and coils 1118 and 1114 function as detectors for a second period, and coil 1118 functions as an excitation coil and coils 1114 and 1116 function as detectors for a third period. These periods are repeated continuously or at specified intervals.

In an alternative embodiment, the functions of coils 1114, 1116, and 1118 are switched or multiplexed in parallel in the frequency domain. For example, coil 1114 functions as an excitation coil based on a driving frequency "A," coil 1116 functions as an excitation coil based on a driving frequency "B," and coil 1118 functions as an excitation coil based on a driving frequency "C." In such an embodiment, all coils 1114, 1116, and 1118 are active all the time, being driven by one frequency and sensing the other two frequencies.

Figure 13:
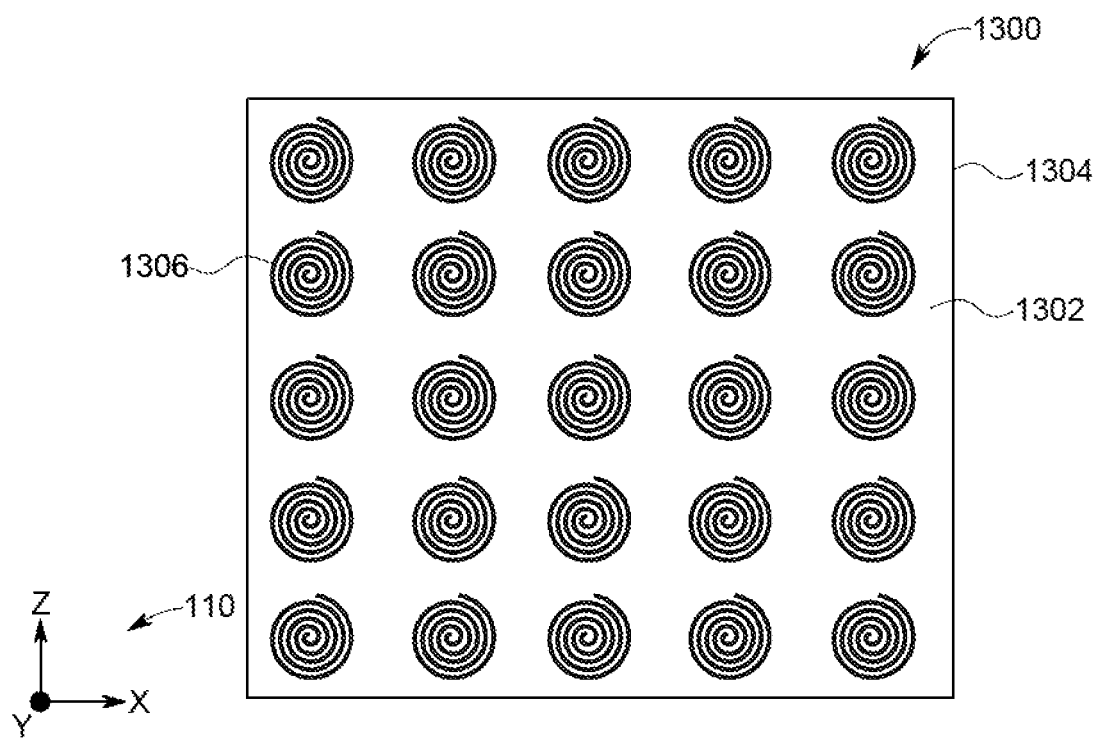
FIG. 13 is a schematic plan view of an alternative sensor head for use in the stress sensing system shown in FIG. 1, looking toward a bottom surface of the substrate.

FIG. 13 is a schematic plan view of an alternative sensor head 1300 looking toward a bottom surface 1302 of a sensor substrate 1304. In this alternative embodiment, sensor head 1300 is configured for measuring stress in different components having various shapes. For example, in some uses, sensor head 1300 is used to measure torque of a shaft. In other uses, sensor head 1300 is used to measure bending of an airfoil. Thus, to accurately measure different stresses in different components depends on how the stresses are orientated in the component. Sensor head 1300 is configured to enable stress sensing system 100 (shown in FIG. 1) to use as much coil area as possible while configuring sensor head 1300 coils to the vector orientation necessitated by the stresses to be measured.

In this alternative embodiment, while substrate 1304 of sensor head 1300 is shown having a generally square shape, it is noted that substrate 1304 is fabricated in any shape that enables sensor head 1300 to function as described herein. For example, and without limitation, in some embodiments, substrate 1304 is generally circular in shape. In this alternative embodiment, sensor head 1300 includes an array of coils 1306 that are formed on bottom surface 1302 of substrate 1304. In this alternative embodiment, substrate 1304 is fabricated from a PCB material, as described herein, and facilitates bending and flexing of sensor substrate 1300. In this alternative embodiment, substrate 1304 is a printed circuit board (PCB) having coils 1306 supported or formed thereon using typical PCB forming techniques. Coils 1306 are fabricated from a conductive material, for example, and without limitation, copper and aluminum. In some embodiments, coils 1306 are fabricated solely from a conductive material. The conductive material is cut, etched, or similarly manipulated in order to achieve a desired shape and size on substrate 1304. In some embodiments, coils 1306 are prefabricated before being bonded to substrate 1304. In other embodiments, a sheet of the conductive material is bonded to substrate 1304 and subsequently cut, etched, or similarly manipulated to achieve the desired shape and size of coils 1306 on substrate 1304.

Also, in this alternative embodiment, coils 1306 have at least two functions. The coils operate simultaneously as an excitation coil, such as excitation coil 18 described herein, and a detection coil, such as detectors 28, also described herein. In such embodiments, the coils 1306 are driven simultaneously by both an AC and a DC source. In addition, an AC source simultaneously transmits signals to the coils at two or more different frequencies.

Figure 14:
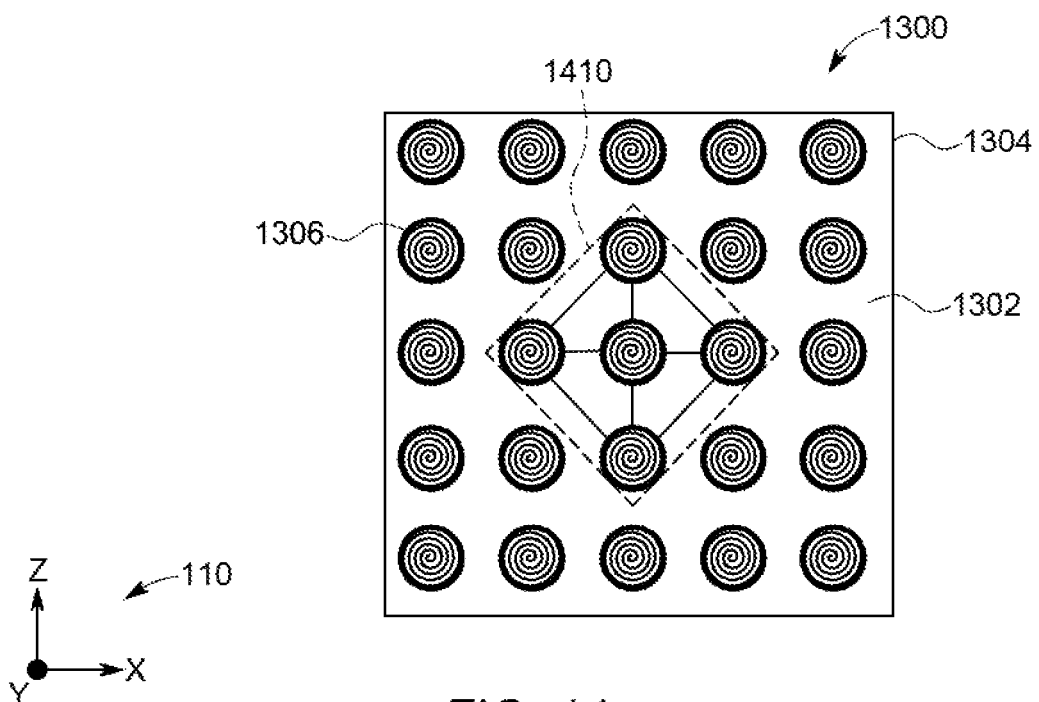
FIG. 14 is a schematic plan view of the sensor head of FIG. 13, showing an example configuration of coils.

FIG. 14 is a schematic plan view of sensor head 1300, showing an example configuration of coils 1306. In operation, sensor head 1300 is configured to sense stress having different vector orientations by reconfiguring the excitation and sense coil arrangements of sensor head 1300. A sensor controller (not shown) turns on and off each coil 1306 of the sensor head 1300, as well as configures each coil to function as an excitation coil or a detector coil. The five central coils 1306, generally indicated by box 1410, are operated as excitation coils by the sensor controller. The remaining coils 1306 are operated as detector coils. As is seen, different coils 1306 are grouped, including into more than one group, to function as either excitation coils or detector coils. Thus, based on the application of sensor head 1300, the configuration of coils 1306 is arranged to facilitate increasing the sensitivity and accuracy of the sensor head 1300.

Figure 15:
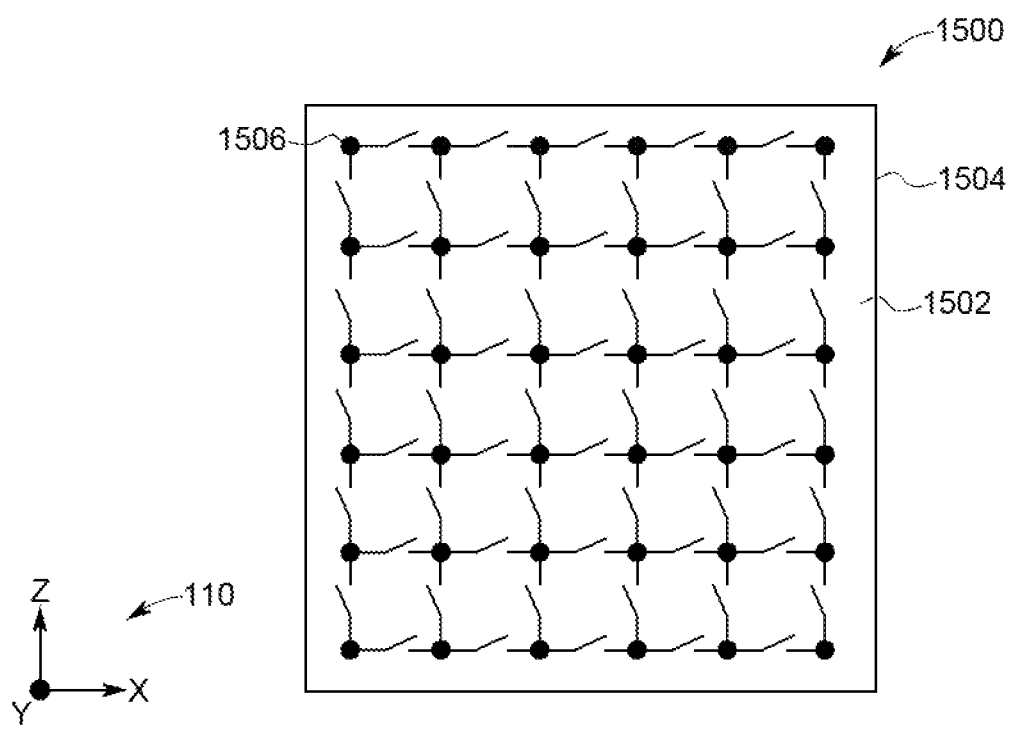
FIG. 15 is a schematic plan view of another alternative sensor head for use in the stress sensing system shown in FIG. 1, looking toward a bottom surface of the substrate.

FIG. 15 is a schematic plan view of an alternative sensor head 1500 looking toward a bottom surface 1502 of a substrate 1504. In this alternative embodiment, sensor head 1500 is configured for measuring stress in different components having various shapes. For example, and without limitation, in some uses, sensor head 1500 is used to measure torque of a shaft, while in other uses, sensor head 1500 is used to measure bending of an airfoil. Thus, to accurately measure different stresses in different components depends on how the stresses are orientated in the component. Sensor head 1500 is configured to enable stress sensing system 100 (shown in FIG. 1) to use as much sensor area as possible while configuring sensor head 1500 to the vector orientation necessitated by the stresses to be measured.

In this alternative embodiment, while substrate 1504 of sensor head 1500 is shown having a generally square shape, it is noted that substrate 1504 is fabricated in any shape that enables sensor head 1500 to function as described herein. For example, and without limitation, in some embodiments, substrate 1504 is generally circular in shape. In this alternative embodiment, sensor head 1500 includes an array of micro-switches 1506 that are formed on bottom surface 1502 of substrate 1504. For example, and without limitation, micro-switches 1506 are formed as a MEMS-based circuitry device.

Also, in this alternative embodiment, substrate 1504 is fabricated from a PCB material, as described herein, and facilitates bending and flexing of sensor substrate 1500. In this alternative embodiment, substrate 1504 is a printed circuit board (PCB) having switches 1506 supported or formed thereon. Switches 1506 are etched, or similarly manipulated in order to achieve a desired shape and size on substrate 1504. In some embodiments, switches 1506 are prefabricated before being bonded to substrate 1504. In other embodiments, a sheet of the conductive material is bonded to substrate 1504 and subsequently cut, etched, or similarly manipulated to achieve the desired shape and size of switches 1506 on substrate 1504.

Figure 16:
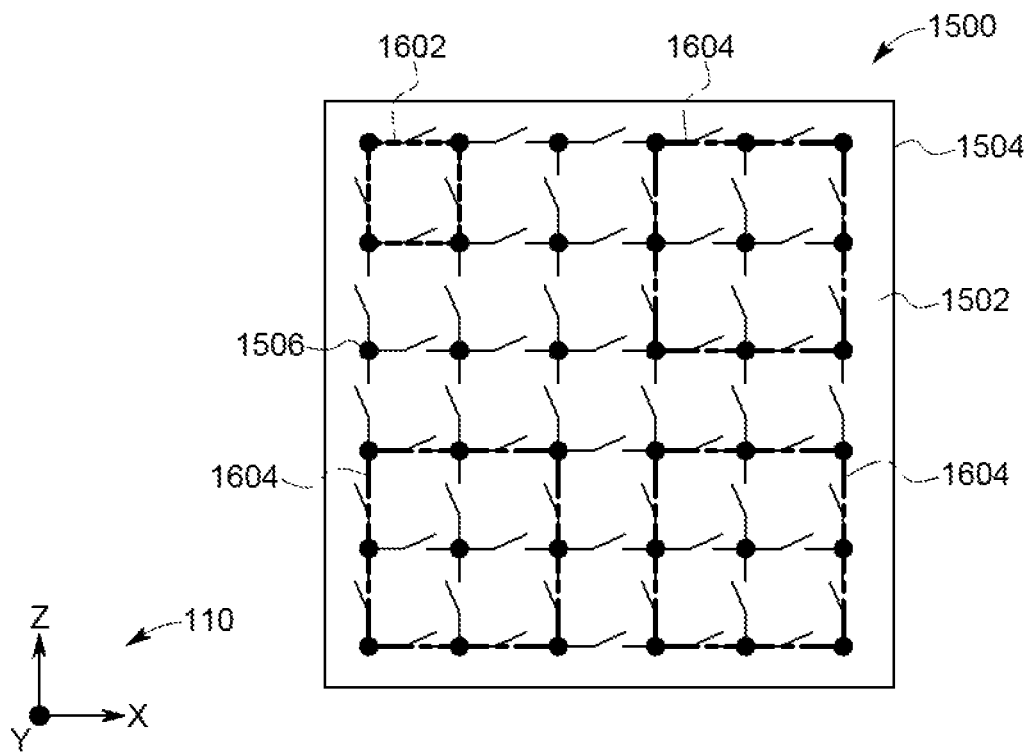
FIG. 16 is a schematic plan view of sensor head 1500, showing an example configuration of switches.

FIG. 16 is a schematic plan view of sensor head 1500, showing an example configuration of switches 1506. In operation, sensor head 1500 is configured to sense stress having different vector orientations by reconfiguring the excitation and sense areas of sensor head 1500. A sensor controller (not shown) opens and closes each switch 1506 of the sensor head 1500, as well as configures areas closed by switches 1506 to function as an excitation coil or a detector coil. Four switches 1506, generally indicated by box 1602, are closed and operated as an excitation coil by the sensor controller. In addition, three groups of eight switches, generally indicated by boxes 1604, are closed and operated as detector coils. As seen, different switches 1506 are grouped, including into more than one group, to function as either excitation coils or detector coils. Thus, based on the application of sensor head 1500, the configuration of switches 1506 is arranged to facilitate increasing the sensitivity and accuracy of the sensor head 1500.

Figure 17:
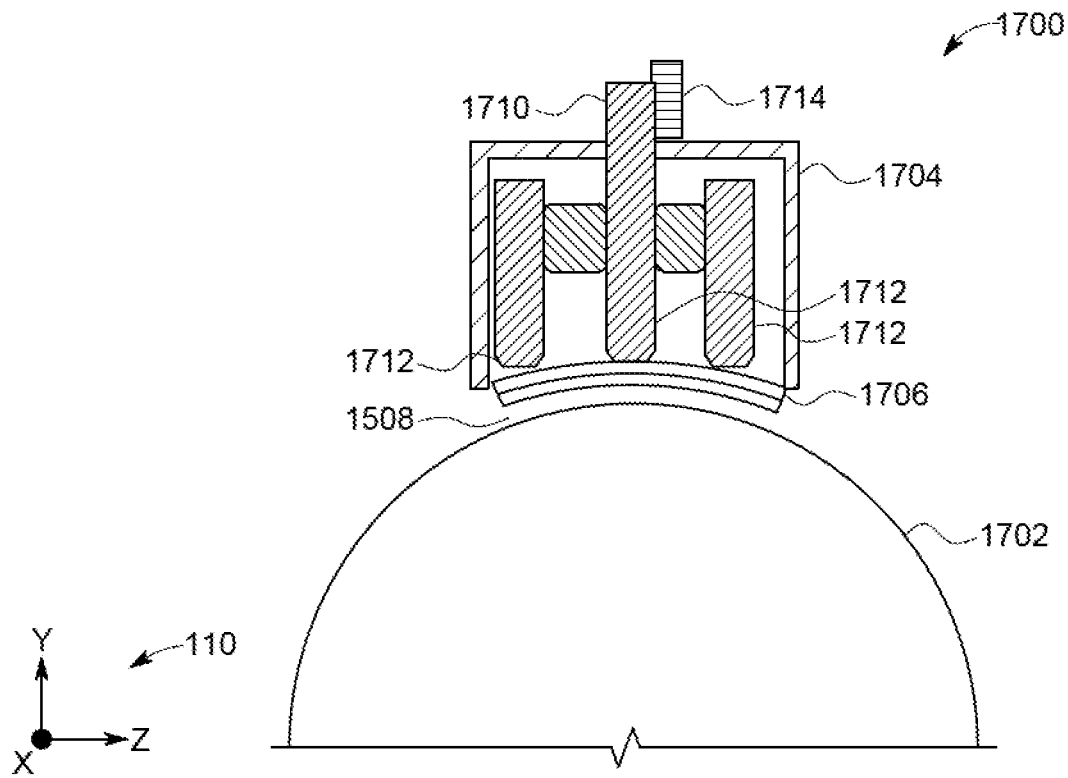
FIG. 17 is a schematic view of an alternative stress sensing system for sensing the stress in a rotatable shaft.

FIG. 17 is a schematic view of an alternative stress sensing system 1700 for sensing the stress in a rotatable shaft 1702. In this alternative embodiment, stress sensing system 1700 includes a housing 1704 configured to adjust an amount of flex or bending in a sensor head 1706 to match the curvature of rotatable shaft 1702. Sensor head 1706 is positioned proximate to rotatable shaft 1702 with a gap 1508 defined between sensor head 1706 and rotatable shaft 1702. Housing 1704 includes an adjustment mechanism 1710 that includes one or more adjustment rods 1712 coupled to sensor head 1706. In this alternative embodiment, coordinate system 110 represents a cylindrical coordinate system. The x-axis represents an axial direction and extends substantially parallel to the rotation axis of rotatable shaft 1702. The y-axis represents a radial direction extending out from the x-axis, and the z-axis represents the circumferential direction.

In this alternative embodiment, sensor head 1706 includes one or more excitation coils (not shown) and one or more detector coils (not shown) consistent with the embodiments described herein. Sensor head 1706 is fabricated from a PCB material, as described herein, and facilitates bending and flexing of sensor head 1706 to change its curvature to a curvature compatible with rotatable shaft 1702. In this alternative embodiment, sensor head 1706 is positioned proximate rotatable shaft 1702 leaving a predefined gap 1508 therebetween. In some embodiments, the curvature of rotatable shaft 1702 is such that gap 1508 is not consistent across the entirety of the gap. Adjustment mechanism 1710 is configured to change the curvature of sensor head 1706 by moving one or more adjustment rods 1712 coupled to sensor head 1706, thereby adjusting the shape of sensor head 1706 to set a consistent gap 1508. Adjustment rods 1712 are configured to be manually moved, or moved via a motor (not shown) and a motor controller (not shown). In this alternative embodiment, adjustment mechanism 1710 includes a measuring component 1714 coupled to housing 1704 for presenting an amount of adjusted curvature of sensor head 1706. For example, and without limitation, measuring component 1714 is a mechanical, optical, electrical, or magnetic measuring device.

Figure 18:
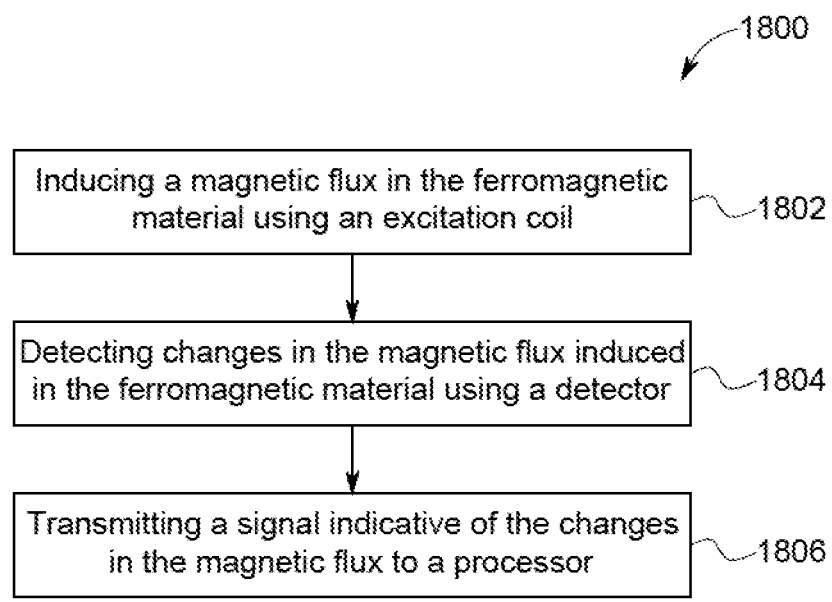
FIG. 18 is a flow chart of an exemplary method for measuring stress in a ferromagnetic material using the stress sensing system of FIG. 1.

FIG. 18 is a flow chart of an exemplary method 1800 for measuring stress in a ferromagnetic material using exemplary stress sensing system 100 (shown in FIG. 1). Referring to FIGS. 1, 17, and 18, in the exemplary embodiment, a magnetic flux 26 is induced 1802 in ferromagnetic material 12. Magnetic flux 26 is induced with excitation coil 18, which is part of sensor head 14. Sensor head 14 is positioned proximate ferromagnetic material 12 with a gap 16 defined between excitation coil 18 and ferromagnetic material 12. In some embodiments, a curvature of sensor head 14 is adjusted by adjustment mechanism 1710 to facilitate maintaining a consistent gap 16 between sensor head 14 and ferromagnetic material 12. In the exemplary embodiment, changes in magnetic flux 26 induced in ferromagnetic material 12 are detected 1804 by detector 28. In the exemplary embodiment, detector 28 is a coil formed on bottom surface 20 of substrate 22 of sensor head 14. Alternatively, detector 28 is one of several types of magnetic field sensors including, without limitation, magnetoresistive, flux gate, Hall Effect, and magnetoinductive sensors. Detector 28 is configured to transmit 1806 a signal indicative of the changes in magnetic flux 26 to processor 30, wherein the changes in magnetic flux 26 are a result of stress in ferromagnetic material 12.

Figure 19:
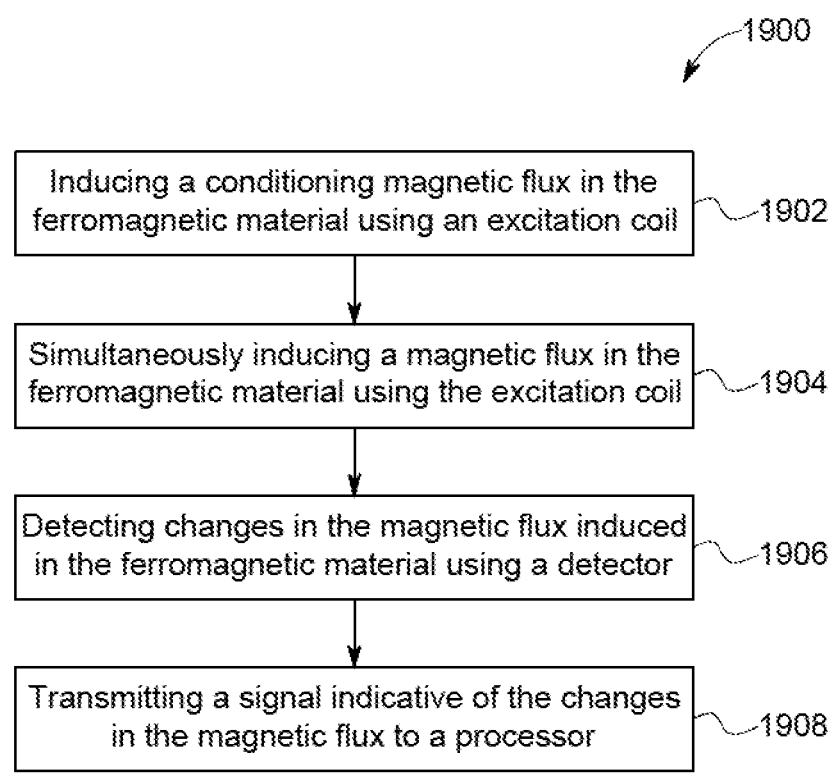
FIG. 19 is a flow chart of an alternative method for measuring stress in a ferromagnetic material using the stress sensing system of FIG. 1.

FIG. 19 is a flow chart of an alternative method 1900 for measuring stress in a ferromagnetic material using exemplary stress sensing system 100 (shown in FIG. 1). Referring to FIGS. 1, 17, and 19, in this alternative embodiment, a conditioning magnetic flux is induced 1902 in ferromagnetic material 12. Excitation coil 18, driven by either a DC or an AC signal, is used to induce conditioning magnetic flux. Simultaneously, magnetic flux 26 is induced 1904 in ferromagnetic material 12. Magnetic flux 26 is also induced with excitation coil 18, which is part of sensor head 14. Sensor head 14 is positioned proximate ferromagnetic material 12 with a gap 16 defined between excitation coil 18 and ferromagnetic material 12. In some embodiments, a curvature of sensor head 14 is adjusted by adjustment mechanism 1710 to facilitate maintaining a consistent gap 16 between sensor head 14 and ferromagnetic material 12. In this alternative embodiment, changes in magnetic flux 26 induced in ferromagnetic material 12 are detected 1906 by detector 28. In this alternative embodiment, detector 28 is a coil formed on bottom surface 20 of substrate 22 of sensor head 14. Alternatively, detector 28 is one of several types of magnetic field sensors including, without limitation, magnetoresistive, flux gate, Hall Effect, and magnetoinductive sensors. Detector 28 is configured to transmit 1908 a signal indicative of the changes in magnetic flux 26 to processor 30, wherein the changes in magnetic flux 26 are a result of stress in ferromagnetic material 12.

Figure 20:
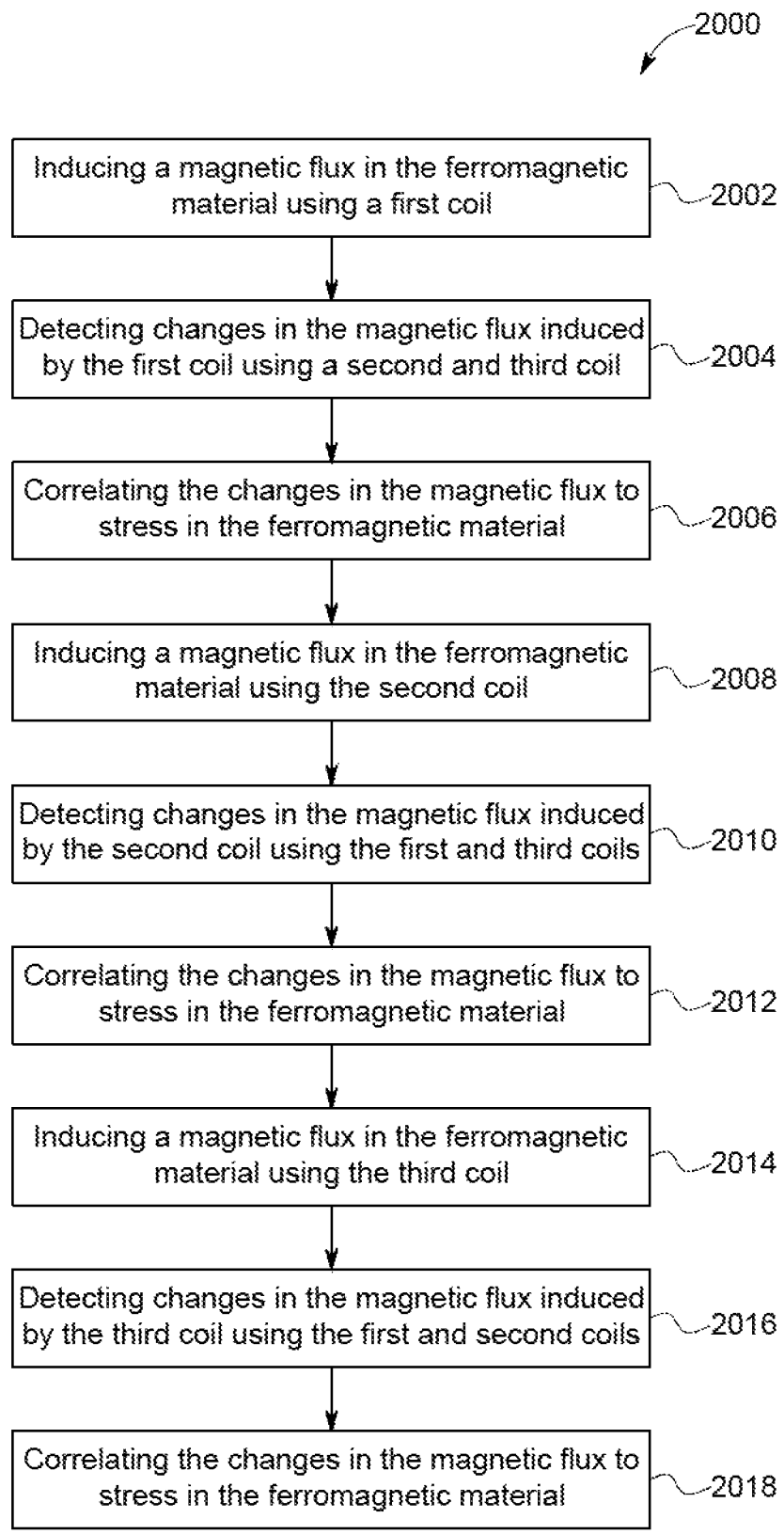
FIG. 20 is a flow chart of an alternative method for measuring stress in a ferromagnetic material using the stress sensing system of FIG. 1 and the substrate of FIG. 9.

FIG. 20 is a flow chart of an alternative method 2000 for measuring stress in a ferromagnetic material using exemplary stress sensing system 100 (shown in FIG. 1) and substrate 1100 (shown in FIGS. 11 and 12). Referring to FIGS. 1, 11, 12, 17, and 20, in this alternative embodiment, a magnetic flux 26 is induced 2002 in ferromagnetic material 12. Magnetic flux 26 is induced by a first coil 1114, which is part of substrate 1100. Substrate 1100 is positioned proximate ferromagnetic material 12 with a gap 16 defined between substrate 1100 and ferromagnetic material 12. In this alternative embodiment, changes in magnetic flux 26 induced by coil 1114 in ferromagnetic material 12 are detected 2004 by a second coil 1116 and a third coil 1118. The changes in magnetic flux 26 are at least partially correlated 2006 to stress in ferromagnetic material 12. In addition, magnetic flux 26 is induced 2008 in ferromagnetic material 12 by second coil 1116. Changes in magnetic flux 26 induced by coil 1116 in ferromagnetic material 12 are detected 2010 by first coil 1114 and a third coil 1118. The changes in magnetic flux 26 are at least partially correlated 2012 to stress in ferromagnetic material 12. Moreover, magnetic flux 26 is induced 2014 in ferromagnetic material 12 by third coil 1118. Changes in magnetic flux 26 induced by coil 1118 in ferromagnetic material 12 are detected 2016 by first coil 1114 and a second coil 1116. The changes in magnetic flux 26 are at least partially correlated 2018 to stress in ferromagnetic material 12. Coils 1114, 1116, and 1118 are configured to transmit signals indicative of the detected changes in magnetic flux 26 induced by respective coils to processor 30, wherein the changes in magnetic flux 26 are a result of stress in ferromagnetic material 12. The magnetic flux inducing and detecting operations of method 2000 are performed sequentially by coils 1114, 1116, and 1118 in a time domain configuration, or are performed substantially simultaneously in a frequency domain configuration, as described herein.

In contrast to known magnetostrictive sensors, the stress sensing sensors, systems, and methods described herein facilitate increasing the sensitivity of the sensors, reducing the physical size of the sensors, reducing the manufacturing cost of the sensors, and resolving stress and the orientation/proximity of the sensor. Specifically, the stress sensing sensors and systems described herein facilitate inducing a magnetic flux in a ferromagnetic material using magnetic field inducing devices such as planar coils formed on PCBs and driven by either a DC source or an AC source to facilitate measuring both transient and steady state stress in the ferromagnetic material. Detecting the changes in the magnetic flux includes using planar coils formed on PCBs, and other magnetic field sensors (magnetometers) such as magnetoresistive, flux gate, Hall Effect, and magnetoinductive sensors. Therefore, in contrast to known magnetostrictive sensors, the stress sensing sensors, systems, and methods described herein facilitate increasing the sensitivity, reducing the physical size, and simplifying the manufacturing of the sensors used in the stress sensing system in a manner that reduces costs and simplifies installation. Also, in contrast to known magnetostrictive sensors, the stress sensing sensors, systems, and methods described herein facilitate measuring both transient and steady-state stresses in the ferromagnetic material.

An exemplary technical effect of the sensors, systems, and methods described herein includes at least one of: (a) inducing a conditioning magnetic flux in a ferromagnetic material; (b) inducing a measuring magnetic flux in the ferromagnetic material; (c) detecting changes in the measuring magnetic flux; (d) inducing a magnetic flux in the ferromagnetic material using a first coil; (e) detecting changes in the magnetic flux induced by the first coil using a second and third coil; (f) inducing a magnetic flux in the ferromagnetic material using the second coil; (g) detecting changes in the magnetic flux induced by the second coil using the first and third coils; (h) inducing a magnetic flux in the ferromagnetic material using the third coil; and (i) detecting changes in the magnetic flux induced by the third coil using the first and second coils. These technical effects facilitate resolving stress and sensor orientation with respect to the ferromagnetic material.

Exemplary embodiments of an apparatus, systems, and methods for sensing stress in ferromagnetic materials are described above in detail. The apparatus, systems, and methods described herein are not limited to the specific embodiments described, but rather, components of apparatus, systems, and/or operations of the methods may be utilized independently and separately from other components and/or operations described herein. For example, and without limitation, the methods may also be used in combination with other stress sensing apparatus, systems, and methods, and are not limited to practice with only the apparatus, systems, and methods, as is described herein. Rather, the exemplary embodiments can be implemented and utilized in connection with many stress sensing system applications.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

Some embodiments involve the use of one or more electronic or computing devices. Such devices typically include a processor, processing device, or controller, such as a general purpose central processing unit (CPU), a graphics processing unit (GPU), a microcontroller, a reduced instruction set computer (RISC) processor, an application specific integrated circuit (ASIC), a programmable logic circuit (PLC), a field programmable gate array (FPGA), a digital signal processing (DSP) device, and/or any other circuit or processing device capable of executing the functions described herein. The methods described herein may be encoded as executable instructions embodied in a computer readable medium, including, without limitation, a storage device and/or a memory device. Such instructions, when executed by a processing device, cause the processing device to perform at least a portion of the methods described herein. The above examples are exemplary only, and thus are not intended to limit in any way the definition and/or meaning of the term processor and processing device.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. A sensor for sensing stress in a ferromagnetic material, the sensor comprising:
    a non-magnetic substrate extending in a first, second, and third direction, the substrate comprising:
        a first layer comprising a first bottom surface and a first top surface opposite the first bottom surface, wherein the first bottom surface extends along the first direction and the second direction; and
        a second layer comprising a second bottom surface and a second top surface opposite the second bottom surface, the second bottom surface coupled to said first top surface of the first layer, wherein the second bottom surface extends along the first direction and the second direction;
    a first coil coupled to the second bottom surface and configured to induce a magnetic flux in the ferromagnetic material, wherein the first coil is configured to be driven by a first alternating current (AC) signal;
    a second coil coupled to the first bottom surface and positioned to overlap at least a portion of said first coil in at least one of the first and second directions, the second coil configured to detect changes in the magnetic flux induced in the ferromagnetic material; and
    a ferromagnetic core coupled to the second top surface.

2. The sensor in accordance with claim 1, wherein the non-magnetic substrate further comprises a third layer comprising a third bottom surface and a third top surface opposite the third bottom surface, the third top surface coupled to the second bottom surface, wherein the third bottom surface extends along the first direction and the second direction, the sensor further comprising a third coil coupled to the third bottom surface, the third coil positioned to overlap at least a portion of the first coil and the second coil in at least one of the first and second directions.

3. The sensor in accordance with claim 1, further comprising a shielding material coupled to the first bottom surface and extending about a periphery of the first coil and the second coil.

4. The sensor in accordance with claim 1, wherein the second coil comprises at least two second coils, each second coil of the at least two second coils positioned to overlap at least a portion of the first coil in at least one of the first and second directions, wherein the at least two second coils are spaced equidistant from each other with respect to the first coil.

5. The sensor in accordance with claim 4, wherein the core comprises a central portion and at least two members extending outward from the central portion, each member of the at least two members being positioned opposite a respective coil of the at least two second coils.

* * * * *